United States Patent [19]

Yonemasu et al.

[11] Patent Number: 4,982,494

[45] Date of Patent: Jan. 8, 1991

[54] METHODS OF MAKING A LOW CAPACITANCE INTEGRATED CIRCUIT PACKAGE

[75] Inventors: Hiro Yonemasu; Kiyohide Shirai, both of San Diego, Calif.; Ikunosuke Kawamura, Vancouver, Wash.

[73] Assignee: Kyocera America, Inc., San Diego, Calif.

[21] Appl. No.: 472,909

[22] Filed: Jan. 31, 1990

Related U.S. Application Data

[62] Division of Ser. No. 307,830, Feb. 6, 1989, Pat. No. 4,931,854.

[51] Int. Cl.$^5$ .......................................... H01R 43/00
[52] U.S. Cl. ...................................................... 29/827
[58] Field of Search ................ 29/827; 174/52.2, 52.3, 174/52.4; 357/65, 69, 70, 74

[56] References Cited

U.S. PATENT DOCUMENTS

| | | | |
|---|---|---|---|
| 3,484,534 | 12/1969 | Kilby et al. | 174/52 |
| 3,566,212 | 2/1971 | Marx | 317/234 |
| 3,617,819 | 11/1971 | Boisvert | 317/234 |
| 3,668,299 | 6/1972 | McNeal | 174/52 PE |
| 3,760,090 | 9/1973 | Fowler | 174/52 S |
| 4,038,488 | 7/1977 | Lin | 174/52 FP |
| 4,142,203 | 2/1979 | Dietz | 357/80 |
| 4,701,424 | 10/1987 | Mikkor | 437/209 |

*Primary Examiner*—P. W. Echols
*Attorney, Agent, or Firm*—Spensley Horn Jubas & Lubitz

[57] ABSTRACT

An integrated circuit package utilizing low temperature sealing glass and having reduced lead capacitance. Voids in the glass material on the base substrate and the cap substrate result in the formation of glass-free cavities when the base substrate is fused to the cap substrate. A lead frame extending from and passing through the glass material which couples the base substrate to the cap substrate also passes through the glass-free cavities, resulting in a reduced parasitic capacitance of the package leads.

17 Claims, 3 Drawing Sheets

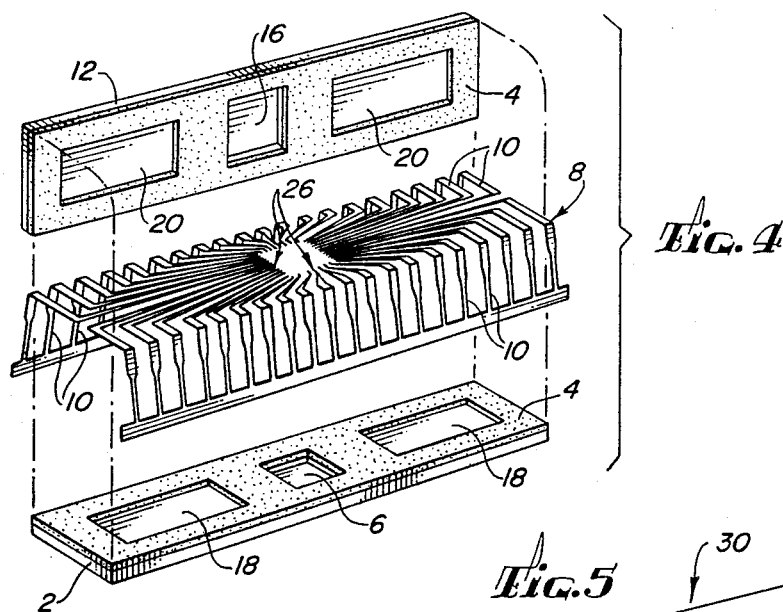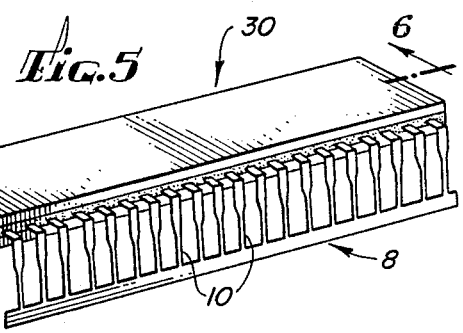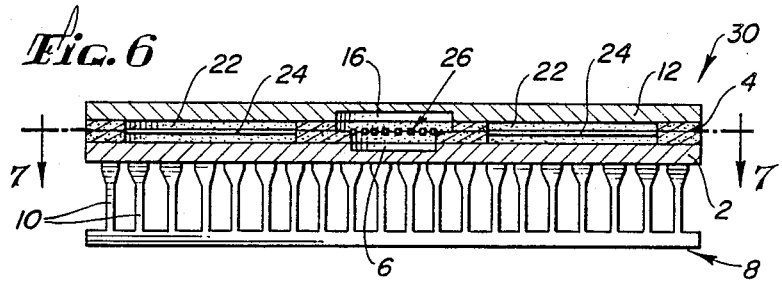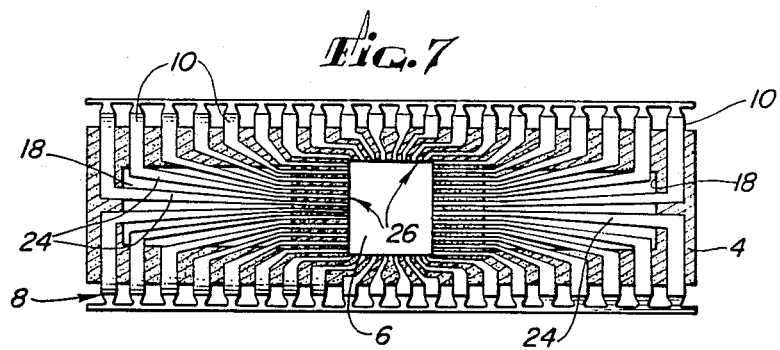

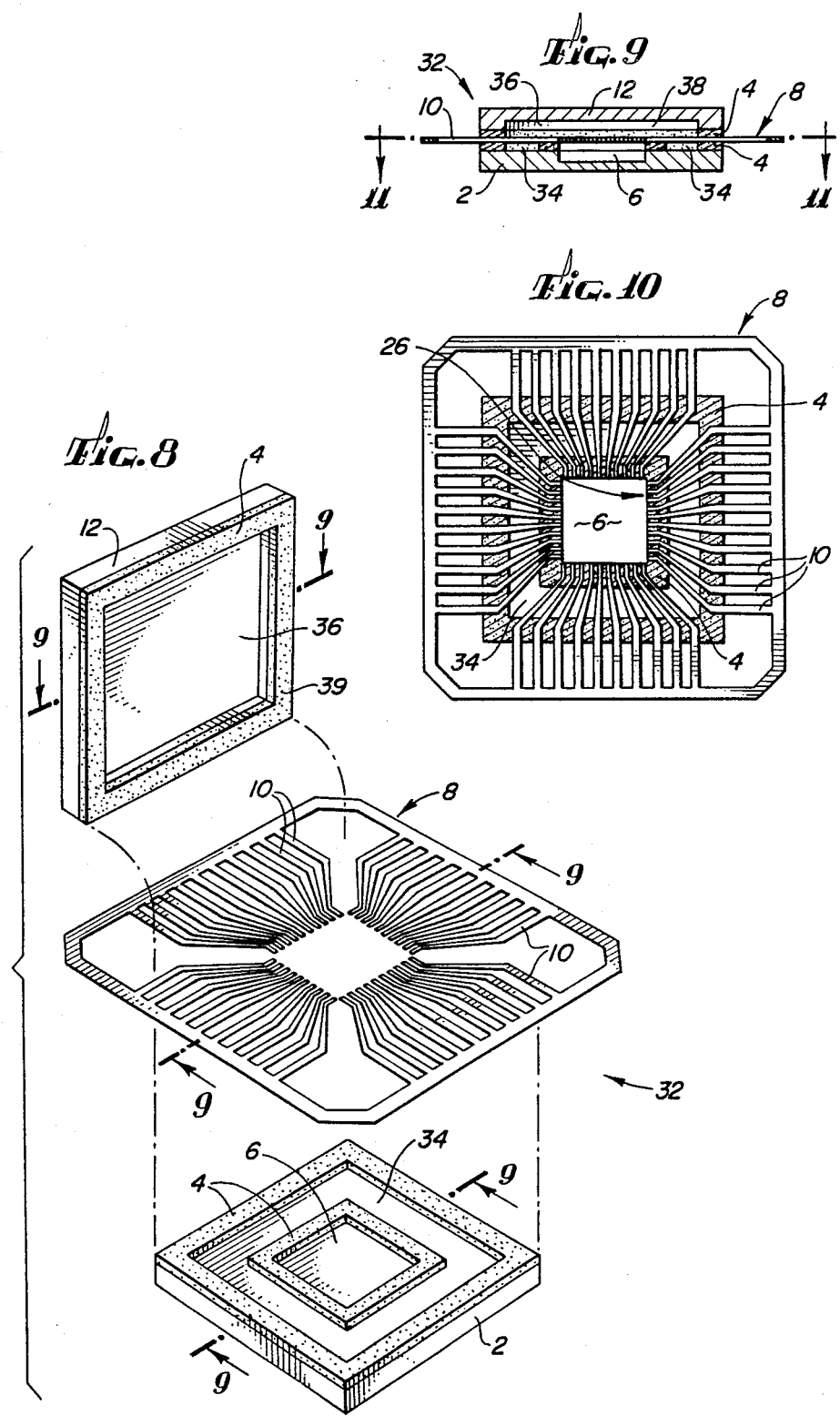

METHODS OF MAKING A LOW CAPACITANCE INTEGRATED CIRCUIT PACKAGE

This is a continuation of application Ser. No. 07/307,830 now U.S. Pat. No. 4,931,854 filed on Feb. 6, 1988.

BACKGROUND OF THE INVENTION

1. Field of the Invention

The present invention relates to the field of integrated circuit packaging, and more specifically to a low lead capacitance ceramic package for integrated circuits.

2. Related Art

Almost all semiconductor components are enclosed in packages when they are incorporated into a working electronic system. More specifically, integrated circuits are almost always enclosed in an appropriate package prior to their sale by the integrated circuit manufacturer.

There are many reasons for providing a proper encapsulation environment around an integrated circuit chip. The order of importance of these packaging factors depends on the particular component considered, and how it is to be tested and utilized. However, there are several functions of packaging for such chips which are common to all chips and environments. For example, appropriate packaging of an integrated circuit chip generally results in a dramatic economy in assembly. Integrated circuit chips are extremely small and fragile and, therefore, are difficult to handle without the aid of magnifying and manipulating equipment. Placement of a chip into an integrated circuit package overcomes the difficulty of handling the chip by providing a relatively large and easily handled package configuration. A second important function fulfilled by integrated circuit packages is mechanical protection of the chips. Because integrated circuit chips are generally comprised of a fragile material, they must be protected from the possibility of scratches and chipping. A third essential function of an integrated circuit package is to shield the enclosed integrated circuit chip from the surrounding environment so as to preclude corrosion and other detrimental effects resulting from exposure to the normal environment.

One frequently utilized integrated circuit package is the ceramic dual in-line package ("CERDIP"). In a CERDIP the body of the package is constructed of an extremely hard ceramic material, and metal electrical leads, which extend from the body, are configured in two parallel rows which are in line with one another.

A second frequently utilized integrated circuit package is the "CERQUAD". As in the CERDIP, the body of the CERQUAD is constructed of a hard ceramic material. However, metal leads extending from the body are configured as two sets of two parallel rows perpendicular to one another, typically with the ceramic body in a square configuration.

CERDIPs and CERQUADs are generally comprised of two basic components: (1) a base having an embedded lead frame, and (2) a cap. In the production of these ceramic packages, a glass material is screened onto a ceramic base (or substrate) so as to cover the base, leaving uncovered only a small chip cavity which is generally in the center of the substrate. Next, the metallic lead frame is positioned in the glass material on the package base such that when the base is heated to an elevated temperature, the glass material becomes molten and flows around the lead frame. Thus, when the glass material has cooled, the lead frame is embedded in the glass material, just above the package base.

The package cap is manufactured in essentially the same way as the package base, but without the embedding of a lead frame. In other words, the ceramic material which will become the package cap is screened with a glass material so as to cover all but a central area in the cap. The cap and glass material are then fired in a furnace to allow the glass material to adhere to the package cap material.

An integrated circuit manufacturer will use a package base and package cap in the following manner: An integrated circuit chip is placed in the central chip cavity in the package base. The integrated circuit chip is affixed to this central cavity, and is electrically connected, via minute wires, to the portion of the lead frame which extends around the central cavity. Once the integrated circuit chip is electrically and mechanically affixed to the package base, the cap is placed on the base and the entire unit is fired at a temperature higher than the temperature used to adhere the glass material to the package base and cap. During this last firing, the glass material may undergo a devitrifying process so as to render the glass material similar to a crystalline ceramic. This crystalline glass, having a greatly increased mechanical strength, then securely couples and seals the cap to the base, resulting in a single device. In most cases, however, a vitreous, non-devitrifying glass is used, which has mechanical strength equivalent to the older, devitrifying glass.

A great deal of research has been performed to develop glass materials which can be accurately screened onto ceramic materials, fired at a relatively low temperature to permit affixing of the glass material to the ceramic material and then fired at higher temperatures to make the final seal.

The development of a relatively low firing temperature solder glass has greatly contributed to the higher reliability of certain integrated circuits. However, this increase in reliability was accompanied by a corresponding and substantial detriment, in that to alter the chemical composition of the glass material, it was necessary to introduce materials such as zirconium and titanium. The introduction of such materials into the glass has significantly increased the dielectric constant in the glass, resulting in a significant increase in the parasitic capacitance between the closely aligned leads of the lead frame. This high parasitic lead capacitance has, in certain situations, precluded the utilization of low temperature ceramic packages for certain integrated circuit chips. Also, even if some integrated circuit chips can be successfully utilized in a low temperature ceramic package at a relatively low frequency, they cannot be used at higher frequencies because excessive parasitic capacitance results in undesirable attenuation, distortion, and cross talk of the electrical signals transmitted by the leads of the package.

SUMMARY OF THE INVENTION

The present invention provides a package for housing an integrated circuit and a method for producing that package. More specifically, the present invention provides an integrated circuit package which utilizes low temperature glass material and has low parasitic capacitance leads.

The package of the present invention includes a base substrate with a lead frame, and a cap substrate. Located on the base substrate is a vitreous or devitrifying glass frit material which is selectively deposited thereon so as to form two or more discrete voids. The cap substrate also has glass material selectively deposited at least around the periphery of the substrate in a relatively narrow sealing ring to form a large void (typical for CERQUAD packages), and optionally also on the substrate so as to form a set of discrete voids that correspond to the voids on the base substrate (typical for CERDIP packages). The voids on the cap are positioned with respect to the voids on the base such that when the cap substrate is placed on the base substrate, the voids in the glass material on the cap substrate are generally aligned with the voids in the glass material on the base substrate. When the cap is positioned on the base, the juncture of the voids in both the cap and base form a plurality of cavities in the glass material.

A lead frame having a plurality of electrical leads is embedded in the glass material on the base substrate so that the lead frame is adjacent and approximately parallel to the substrate, while at least a portion of the leads of the lead frame pass through one or more of the cavities formed in the glass material. Passing a portion of the lead frame leads through such cavities, as opposed to through low temperature glass material, dramatically reduces the parasitic capacitance of the electrical leads.

The novel features which are believed to be characteristic of the invention, both as to its organization and its method of operation, together with further objects and advantages thereof, will be better understood from the following description in connection with accompanying drawings in which a presently preferred embodiment and an alternate embodiment of the invention are illustrated by way of example. It is to be expressly understood, however, that the drawings are provided for illustration and description only and are not intended as a definition of the limits of the invention.

BRIEF DESCRIPTION OF THE DRAWINGS

FIG. 4 is an exploded view of one embodiment of a ceramic package of the present invention;

FIG. 5 is a perspective view of the embodiment of the ceramic package shown in FIG. 4.

FIG. 6 is a cross-sectional side view of the embodiment of the ceramic package shown in FIG. 5;

FIG. 7 is a cross-sectional top view of the embodiment of the ceramic package shown in FIG. 6;

FIG. 8 is an exploded view of an alternate embodiment of the ceramic package of the present invention;

FIG. 9 is a cross-sectional side view of the embodiment of the ceramic package shown in FIG. 8; and FIG. 10 is a cross-sectional top view of the embodiment of the ceramic package shown in FIG. 9.

Like reference characters in the various drawings refer to like elements.

DETAILED DESCRIPTION OF THE INVENTION

The present invention provides a ceramic package which has a low lead parasitic capacitance while still using low temperature sealing glass. The package is generally comprised of a base substrate and a cap substrate, each coated with a vitreous or devitrifying glass frit material. The deposition of the glass frit material is controlled such that there are at least two areas on the base substrate devoid of the glass material. The lead frame of the ceramic package is embedded in the glass material on the base substrate so that the internal leads of the lead frame are partially disposed in one or more of the areas devoid of glass. The routing of the leads of the lead frame through these glass-less areas results in a substantially lessened parasitic capacitance between the leads of the lead frame.

Figure 1:
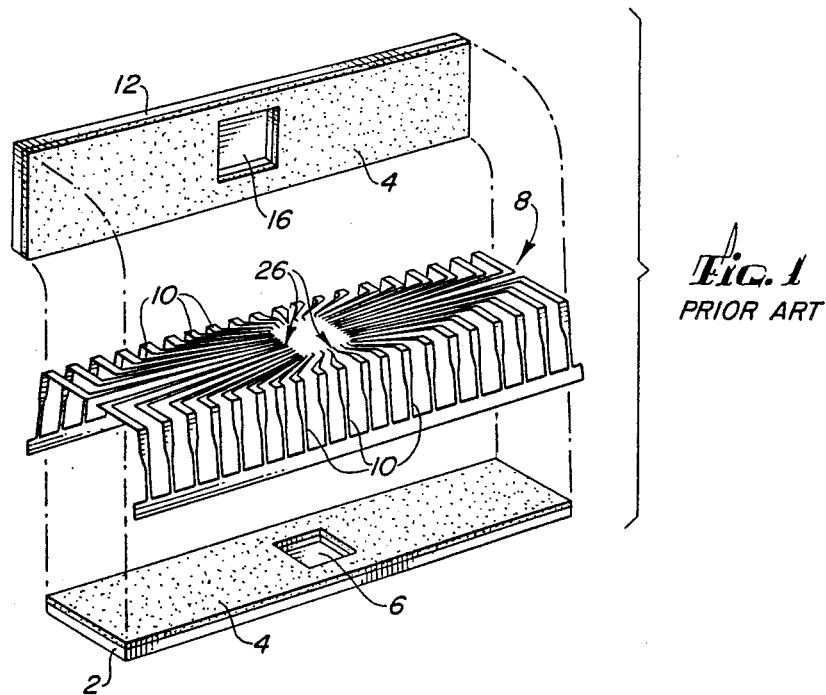
FIG. 1 is an exploded view of the construction of a prior art ceramic dual in-line package.

Referring to FIG. 1, an exploded view of a prior art construction of a ceramic package (in this case a CERDIP) can be seen. The major components of a prior art ceramic package consist of a base substrate 2, a lead frame 8, and a cap substrate 12. A vitreous or devitrifying glass frit material 4 is typically screened onto the base substrate 2 by well known screening processes. As can be seen in FIG. 1, the screening of glass material 4 on the base substrate 2 in the prior art constructions is uniform across the base substrate 2 except for the die attach cavity 6. That is, in the prior art constructions, the only area on the base substrate 2 which is devoid of the vitreous or devitrifying glass frit material 4 is the die attach cavity 6.

In the prior art construction of glass sealed ceramic packages, the cap substrate 12 is also covered with a layer of vitreous or devitrifying glass frit material 4 by the same screening process which is used to apply the glass material 4 on the base substrate 2. Again in the prior art construction, the glass material 4 is deposited uniformly across the cap substrate 12, except for the chip cavity 16, which is devoid of glass material 4.

During the assembly of prior art ceramic packages, a lead frame 8, with its associated leads 10, is embedded in the glass frit material 4 on the base substrate 2. The vitreous or devitrifying glass material 4 is then heated to a temperature at which the glass material 4 becomes semi-liquid and flows around the leads 10 of the lead frame 8. Once the glass material 4 cools, the glass material 4 becomes a solid and thus securely holds the lead frame 8 in its position adjacent to the base substrate 2. The cap substrate 12 and its glass material 4 are similarly heated and then cooled so that the glass material 4 adheres to the cap substrate 12.

In the utilization of a prior art ceramic package such as the CERDIP shown in FIG. 1, an integrated circuit chip (not shown) is placed in the die attach cavity 6. The integrated circuit chip is then bonded to the base substrate 2 and electrically coupled to the lead frame 8. This electrical coupling is performed by connecting minute wires from the integrated circuit chip to the bonding wire pads 26 at the inward-most portion of the leads 10. Next, the cap substrate 12 is placed above the base substrate 2 (having the embedded lead frame 8) and properly aligned with the base substrate 2. The entire assembly is then fired in a furnace at a sealing temperature substantially above the temperature used to create an adherence between the glass material 4 and either the base substrate 2 or cap substrate 12. If a devitrifiable glass is used, this elevated temperature will result in the devitrifying of the glass material 4 and will result in the secure adherence of the cap substrate 12 to the base substrate 2.

The prior art construction of ceramic packages, as illustrated in FIG. 1, is generally very successful in encapsulating an integrated circuit chip in an extremely hard ceramic package. However, due to the passage of the leads 10 of the lead frame 8 through the glass material 4, the electrical parasitic capacitance between the leads 10 is substantially increased in comparison with the passage of such leads 10 through an air environment.

Figure 2:
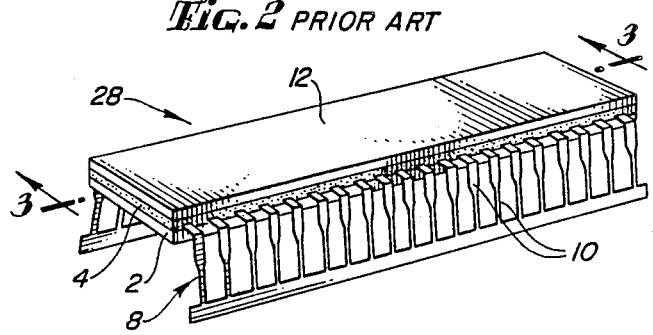
FIG. 2 is a perspective view of a prior art ceramic dual in-line package.

FIG. 2 illustrates in a perspective view a prior art CERDIP 28 in its completed form. The CERDIP 28 includes a cap substrate 12 properly aligned above the base substrate 2, and the lead frame 8 extending out and along the side of the package 28. Following furnace sealing, the glass material 4 on both the base substrate 2 and the cap substrate 12, in fusing together, has fused the base substrate 2 to the cap substrate 12.

Figure 3:
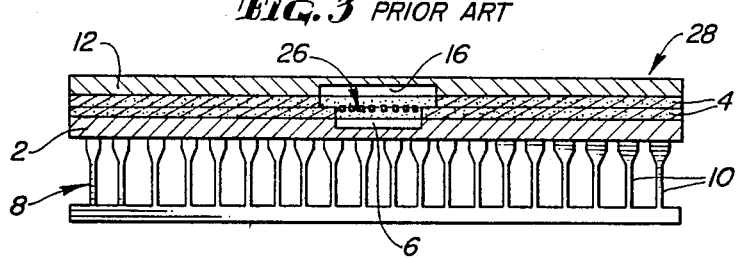
FIG. 3 is a cross-sectional view of a prior art ceramic dual in-line package.

FIG. 3 is a cross-sectional view of the completed prior art CERDIP 28 shown in FIG. 2, taken along the lines 3—3 of FIG. 2. Located above the base substrate 2 is the cap substrate 12, each substrate being fused to the other by the glass material 4. The correspondence of chip cavity 16 in the cap substrate 12 to the die attach cavity 6 in the base substrate 2 results in an open area in the center of the package for locating an integrated circuit chip.

FIG. 4 illustrates, in an exploded view, the construction of one embodiment of a ceramic package of the present invention. As in the prior art construction of a ceramic package, a vitreous or devitrifying glass frit material 4 is deposited on the base substrate 2 by a well known screening process. Also, as in the prior art construction, the glass material 4 is not deposited in the die attach cavity 6. However, in distinction to the prior art construction, glass material 4 is also not deposited in two voids 18 on the base substrate 2.

A glass screening pattern similar to that on the base substrate 2 can also be seen on cap substrate 12. Deposited on cap substrate 12 is vitreous or devitrifying glass frit material 4 which is uniformly deposited across the cap substrate 12, except for the chip cavity 16 and two voids 20.

As in the prior art assembly of a ceramic package, a ceramic package (in this case a CERDIP) embodying the present invention embeds the lead frame 8 in the glass material 4. The entire assembly is heated to an elevated temperature at which the glass material 4 melts and flows around the leads 10 of lead frame 8. However, in distinction to the prior art construction, a significant portion of the leads 10 in the present invention pass through the voids 18 on the base substrate 2 and are thus not totally embedded in the glass material 4. Furthermore, because the voids 20 in the cap substrate 12 are positioned on the cap substrate 12 such that they correspond to the voids 18 on the base substrate 2, when the cap substrate 12 is ultimately placed on the base substrate 2, a portion of the leads 10 will pass through an area within the ceramic package which is totally devoid of glass material 4.

The final assembly of the CERDIP which embodies the present invention does not differ from the prior art assembly. That is, the user of a CERDIP embodying the present invention places an integrated circuit chip in die attach cavity 6, bonds that integrated circuit chip to the base substrate 2, and electrically connects the chip to the bonding pads 26 at the extreme ends of leads 10. Once the integrated circuit chip is installed in the die attach cavity 6, the cap substrate 12 is positioned over the base substrate 2 and the entire assembly is placed in a furnace where it is heated sufficiently to allow the glass material 4 to seal the assembly. This glass sealing process secures the cap substrate 12 to the base substrate 2 and completely seals the integrated circuit chip in the die attach cavity 6.

FIG. 5 illustrates a perspective view of the CERDIP 30 shown in FIG. 4. A comparison of FIG. 2 (the prior art construction) to FIG. 5 shows that there is no external difference between the prior art CERDIP 28 and the CERDIP 30 of the present invention.

FIG. 6 is a cross-sectional view of the CERDIP 30 taken along the lines 6—6 of FIG. 5. As in the prior art construction, the CERDIP 30 of the present invention has a cap substrate 12 located over a base substrate 2. The two substrates are joined by a glass material 4. The leads 10 of the lead frame 8 are partially embedded in glass material 4 and extend into the chip cavity 16. At the extreme ends of the leads 10 of lead frame 8 are the bonding pads 26 located within chip cavity 16. However, an important difference between a prior art CERDIP 28 and a CERDIP 30 embodying the present invention is the inclusion of cavities 22 in the glass material 4. It can be seen in FIG. 6 that the coincidence of the voids 20 in the glass material 4 on the cap substrate 12 and the voids 18 in the glass material 4 on the base substrate 2 result in cavities 22 where there is neither glass material 4 on the base substrate 2 nor the cap substrate 12. Because a significant portion 24 of the leads 10 pass through the cavities 22, a substantial portion of the leads 10 are not embedded in glass material 4. This characteristic of the invention results in significantly lower parasitic capacitance between the electrical leads 10.

FIG. 7 is a cross-sectional top view (taken along the line 7—7 of FIG. 6) of the CERDIP 30 embodying the present invention. The voids 18 in the glass material 4 can be readily seen underlying a portion of the leads 10, denoted 24. Voids 18 and 6 (the die attach cavity) are entirely surrounded by glass material 4 so as to completely seal the die attach cavity 6 and provide a secure bonding between the base substrate 4 and the cap substrate 12. By varying the shape and extent of the voids 18, it is possible to eliminate the glass material 4 from around the greatest length of leads 10, while still maintaining the structural integrity and hermeticity of the package 30.

It has been found desirable to utilize CERQUADs having square configurations for certain integrated circuit chip applications. FIG. 8 illustrates, in an exploded view, the construction of an alternate embodiment of a ceramic package 32 of the present invention having a substantially square configuration and four rows of in-line leads, one row on each side. In this embodiment, a vitreous or devitrifying glass frit material 4 is again uniformly deposited over a portion of a base substrate 2 having a substantially square configuration. Again the glass material 4 is not deposited in the die attach cavity 6. Additionally, the glass material 4 is not deposited in a void 34 on the base substrate 2. Glass material 4 deposited around the periphery of the base substrate 2 surrounds and defines the "outer" portion of the void 34. The void 34 itself substantially surrounds an inner "ring" of glass material 4 that surrounds and defines the die attach cavity 6.

A vitreous or devitrifying glass frit material 4 is also deposited on the cap substrate 12 (which has a substantially square configuration) to form a relatively narrow sealing ring 39 around the periphery of the face of the cap substrate 12. The sealing ring surrounds and defines a void 36. The face of the cap substrate 12 is bonded to a base substrate 2 containing glass material 4 and lead frame 8. Optionally, glass material 4 may be deposited on the cap substrate 12 in a pattern that matches the pattern for a base substrate 2.

A lead frame 8, having a substantially square configuration and four rows of leads, is placed on the base 2. The lead frame 8 is partially embedded in the glass material 4 of the base substrate 2 when the assembly is heated to an elevated temperature at which the glass material melts. As is illustrated in FIGS. 9 and 10, after the CERQUAD 32 has been assembled, a significant portion of the leads 10 passes through a cavity 38 within the ceramic package 32 formed by voids 34 and 36. The cavity 38 is totally devoid of glass material 4. Accordingly, the electrical parasitic capacitance of the embedded leads of a CERQUAD made in accordance with this invention is significantly reduced.

The principle of operation of the present invention can be understood from the following brief discussion. It is well known in the electrical engineering arts that the electrical capacitance of two adjacent conductors is a direct function of the dielectric constant of the material separating the two conductors. It is also well known that the dielectric constant for a perfect vacuum is numerically equal to one. The dielectric constant for air is also approximately equal to one. However, it has been experimentally determined that the dielectric constant for the low temperature glass material 4 typically used to join a base substrate 2 to a cap substrate 12 in typical ceramic package constructions ranges from approximately 12 to approximately 35.

Because the parasitic capacitance between any two leads 10 of a lead frame 8 is directly proportional to the dielectric constant of the material which separates the leads 10, it is apparent that the dielectric constant for low temperature sealing glass material 4 will have a significant impact on the parasitic capacitance. Additionally, it is apparent that if the total amount of glass material 4 surrounding the leads 10 can be reduced by passing a portion of the leads 10 through an area devoid of the glass material 4, the parasitic capacitance between the leads 10 can be reduced.

Experimentation has borne out the theoretical considerations summarized above. To prove the utility of this invention, 40-lead CERDIPs were utilized, some constructed in accordance with the prior art teachings and others constructed in accordance with the present invention. The electrical capacitance between leads 1 and 40 of the prior art CERDIP was measured at a frequency of 1 MHz and a temperature of 25° C. Measurement of that electrical capacitance ranged from 8.4 pF to 9.05 pF for five different 40-lead packages. On the other hand, CERDIP packages embodying the present invention, measured under the same conditions as the prior art CERDIPs, resulted in an electrical capacitance ranging from 3.4 pF to 3.7 pF. These experimental results demonstrate that the inclusion of cavities 22 or 38 in a ceramic package construction results in a reduction of the parasitic capacitance of the electrical leads 10 by a significant factor.

In summary, a novel ceramic package construction has been described herein. While specific embodiments of the present invention have been disclosed and described in detail herein, it will be understood by those skilled in the art that various changes in form and detail may be made without departing from the spirit and scope of the invention. For example, the number and location of the voids in the glass material can be varied from the embodiments disclosed herein without departing from the scope of the present invention. Thus, in the embodiment illustrated in FIGS. 4–7, one large void could be used in lieu of the two cavities 22 disclosed herein. Similarly, in the embodiment illustrated in FIGS. 8–10, four separate voids could be used in lieu of the single cavity disclosed. Furthermore, the exact location and configuration of the cavities can readily be varied without departing from the scope of the present invention. Accordingly, it is to be understood that the invention is not to be limited by the specific illustrated embodiments, but only by the scope of the appended claims.

We claim:

1. A method for manufacturing low-lead capacitance integrated circuit packages comprising the steps of:
    (a) providing a cap substrate;
    (b) depositing a glass material on the cap substrate so as to form at least one discrete void in the glass material;
    (c) providing a base substrate;
    (d) depositing a glass material on the base substrate so as to form a plurality of discrete voids in the glass material, the voids being positioned such that when the cap substrate is placed on the base substrate the at least one void in the glass material on the cap substrate and the voids in the glass material on the base substrate form at least one glass-free cavity;
    (e) providing a lead frame having a plurality of leads; and
    (f) embedding the lead frame in the glass material on the base substrate such that a plurality of the leads of the lead frame are at least partially disposed within the glass-free cavity.

2. The method of claim 1 wherein one of the voids in the glass material on the base substrate is configured such that an integrated circuit chip can be disposed therein adjacent to the base substrate.

3. The method of claim 2 wherein each of the voids in the glass material on the base substrate and the cap substrate is entirely surrounded by the glass material.

4. The method of claim 3 wherein the number of voids in the glass material of the base substrate and the cap substrate is three, respectively, and wherein the voids are disposed along the length of the base substrate and the cap substrate.

5. The method of claim 3 wherein the number of voids in the glass material of the base substrate and on the cap substrate is two, respectively, one of each of the voids of the base substrate and the cap substrate being disposed within the other of the voids of the base substrate and the cap substrate, respectively, and separated therefrom by the glass material.

6. The method of claim 3 wherein the number of voids in the glass material of the base substrate is two, and the number of the voids in the glass material of the cap substrate is one, wherein:
    (a) the void of the cap substrate occupies approximately the entire cap substrate surface except for a peripheral sealing ring of glass material;
    (b) one of the two voids of the base substrate is disposed within the other of the voids of the base substrate and separated therefrom by the glass material;
    (c) the peripheral sealing ring of the cap substrate is positioned whereby when the cap substrate is placed on the base substrate the peripheral sealing ring of the cap substrate is adjacent the glass material surrounding the outer of the two voids of the base substrate, thereby forming a complete sealing ring; and (d) the void of the cap substrate thereby forms one cavity in the glass material with the two voids of the base substrate.

7. A method for manufacturing low-lead capacitance caps for use in packaging integrated circuit chips comprising the steps of:

(a) providing a cap substrate;

(b) depositing a glass material on the cap substrate so as to form at least one discrete void in the glass material, the at least one void being positioned such that when the cap substrate is placed on an associated base substrate having voids in a glass material deposited thereon, the at least one void on the cap substrate and the voids in the base substrate form at least one glass-free cavity.

8. The method of claim 7 wherein each of the voids in the glass material on the cap substrate is entirely surrounded by the glass material.

9. The method of claim 8 wherein the number of voids in the glass material on the cap substrate is three, and wherein the voids are disposed along the length of the substrate.

10. The method of claim 8 wherein the number of voids in the glass material on the cap substrate is two, one of the voids being disposed within the other of the voids and separated therefrom by the glass material.

11. A method of manufacturing low-lead capacitance bases for use in packaging integrated circuit chips comprising the steps of:

(a) providing a base substrate;

(b) depositing a glass material on the base substrate so as to form a plurality of discrete voids in the glass material, the voids being positioned such that when an associated cap substrate having at least one void in a glass material deposited thereon is placed on the base substrate, the voids on the base substrate and the at lease one void on the cap substrate form at least one glass-free cavity;

(c) providing a lead frame having a plurality of leads; and (d) embedding the lead frame in the glass material on the base substrate such that at least a portion of a plurality of the leads of the lead frame are disposed in the glass-free cavity.

12. The method of claim 11 wherein each of the voids in the glass material on the base substrate is entirely surrounded by the glass material.

13. The method of claim 12 wherein the number of voids in the glass material on the base substrate is three, and wherein the voids are disposed along the lengths of the substrate.

14. The method of claim 12 wherein the number of voids in the glass material on the base substrate is two, one of the voids being disposed within the other of the voids and separated therefrom by the glass material.

15. A method for manufacturing low-lead capacitance integrated circuit packages comprising the steps of:

(e) providing a cap substrate;

(f) depositing a sealing material on the cap substrate so as to form at least one discrete void in the sealing material;

(g) providing a base substrate;

(h) depositing a sealing material on the base substrate so as to form a plurality of discrete voids in the sealing material, the voids being positioned such that when the cap substrate is placed on the base substrate the at least one void in the sealing material on the cap substrate and the voids in the sealing material on the base substrate form at least one sealing material-free cavity;

(i) providing a lead frame having a plurality of leads; and (j) embedding the lead frame in the sealing material on the base substrate such that a plurality of the leads of the lead frame are at least partially disposed within the sealing material-free cavity.

16. A method for manufacturing low-lead capacitance caps for use in packaging integrated circuit chips comprising the steps of:

(a) providing a cap substrate;

(b) depositing a sealing material on the cap substrate so as to form at least one discrete void in the sealing material, the at least one void being positioned such that when the cap substrate is placed on an associated base substrate having voids in a sealing material deposited thereon, the at least one void on the cap substrate and the voids in the base substrate form at least one sealing material-free cavity.

17. A method for manufacturing low-lead capacitance bases for use in packaging integrated circuit chips comprising the steps of:

(a) providing a base substrate:

(b) depositing a sealing material on the base substrate so as to form a plurality of discrete voids in the sealing material, the voids being positioned such that when an associated cap substrate having at least one void in a sealing material deposited thereon is placed on the base substrate, the voids on the base substrate and the at least one void on the cap substrate form at least one sealing material-free cavity;

(c) providing a lead frame having a plurality of leads; and (d) embedding the lead frame in the sealing material on the base substrate such that at least a portion of a plurality of the leads of the lead frame are disposed in the sealing material-free cavity.

* * * * *